United States Patent
Tsai et al.

(10) Patent No.: US 7,955,897 B2
(45) Date of Patent: Jun. 7, 2011

(54) CHIP STRUCTURE AND STACKED CHIP PACKAGE AS WELL AS METHOD FOR MANUFACTURING CHIP STRUCTURES

(75) Inventors: Tsung Yueh Tsai, Kaohsiung (TW); Yi Shao Lai, Yonghe (TW); Cheng Wei Huang, Kaohsiung (TW)

(73) Assignee: Advanced Semiconductor Engineering, Inc., Pingtung (TW)

( * ) Notice: Subject to any disclaimer, the term of this patent is extended or adjusted under 35 U.S.C. 154(b) by 305 days.

(21) Appl. No.: 12/188,621

(22) Filed: Aug. 8, 2008

(65) Prior Publication Data
US 2009/0230564 A1 Sep. 17, 2009

(30) Foreign Application Priority Data

Mar. 11, 2008 (TW) ................................ 97108439 A

(51) Int. Cl.
*H01L 21/44* (2006.01)

(52) U.S. Cl. ........ 438/113; 438/458; 438/462; 257/620; 257/E21.237; 257/E21.238; 257/E21.559

(58) Field of Classification Search .................. 438/113, 438/458, 462; 257/E21.237, E21.238, E21.599
See application file for complete search history.

(56) References Cited

U.S. PATENT DOCUMENTS

| 5,989,982 A * | 11/1999 | Yoshikazu ..................... 438/462 |
| 6,174,751 B1 * | 1/2001 | Oka .............................. 438/113 |
| 7,242,101 B2 * | 7/2007 | Ararao et al. ................. 257/784 |
| 2006/0267609 A1 * | 11/2006 | Lee et al. ...................... 324/754 |

* cited by examiner

*Primary Examiner* — Andy Huynh
(74) *Attorney, Agent, or Firm* — Lowe, Hauptman, Ham & Berner, LLP

(57) ABSTRACT

A chip structure according to the present invention is provided. A plurality of pedestals extends from the back surface of the chip structure. Each of the pedestals is located at a position away from the edge of the back surface for a non-zero distance so that the pedestals of an upper chip structure will not damage the bonding pads positioned on the edge of the active surface of a lower chip structure when the upper chip structure is stacked on the active surface of the lower chip structure with the pedestals.

5 Claims, 5 Drawing Sheets

US 7,955,897 B2

CHIP STRUCTURE AND STACKED CHIP PACKAGE AS WELL AS METHOD FOR MANUFACTURING CHIP STRUCTURES

CROSS REFERENCE TO RELATED APPLICATION

This application claims the priority benefit of Taiwan Patent Application Serial Number 097108439 filed Mar. 11, 2008, the full disclosure of which is incorporated herein by reference.

BACKGROUND OF THE INVENTION

1. Field of the Invention

The invention relates to a chip structure, a stacked chip package and a method for manufacturing chip structures and more particularly, to a chip structure with pedestals, a stacked chip package with the above chip structure and a method for manufacturing chip structures with pedestals.

2. Description of the Related Art

In the electronics industry, as products become smaller and smaller, increased miniaturization of integrated circuit (IC) packages has become more and more critical. At the same time, higher performance and lower cost have become essential for new products.

In order to put more integrated circuit chips in a single package to reduce the profile of the product, the manufacturers in the art have begun to stack chips on each other. It is required for these chips to have a gap between them for wire bonding. The gap can be achieved by means of a thick layer of organic adhesive or in combination with inorganic spacers of material such as silicon, ceramic, or metal. However, the above stacked chips with organic or inorganic spacers all are manufactured with more complicated process.

Referring to FIG. 1, in order to solve the above problems, the U.S. Pat. No. 7,242,101 has disclosed a chip 100 with pedestals. The four corners of the back surface 112 of the rectangular chip 100 are respectively positioned with four rectangular pedestals 122, wherein two of the four sides of the each pedestal 122 are respectively coplanar with two of the four side surfaces of the chip 100. When the chip 100 is stacked on other chip, the pedestals 122 are disposed on the active surface of the lower chip to achieve a gap between the two chips for wire bonding. However, the pads for wire bonding are typically positioned on the edge of the active surface of a chip. Thus, the pedestals 122 will be always positioned on the bonding pads of a lower chip when the chip 100 is attempted to be stacked on the substantially equally-sized lower chip. This will cause the lower chip not to be wire bonded.

Accordingly, there exists a need to provide a chip structure to solve the above-mentioned problems.

SUMMARY OF THE INVENTION

It is an object of the present invention to provide a chip structure that can be stacked on another chip without need of an additional spacer or dummy chip to maintain a gap between the two chips for wire bonding.

In order to achieve the above object, the chip structure according to the present invention includes an active surface, a back surface, and a plurality of pedestals perpendicularly extending from the back surface and disposed away from the edge of the back surface for a non-zero distance.

It is another object of the present invention to provide a stacked chip package.

In order to achieve the above object, the stacked chip package according to the present invention is to stack the above chip structure of the present invention on the active surface of another chip structure. The active surfaces of the two chip structures are electrically connected to the carrier for carrying these chip structures by bonding wires.

It is a further object of the present invention to provide a method for manufacturing chip structures.

In order to achieve the above object, the method for manufacturing chip structures according to the present invention is to define a plurality of first longitudinal areas and a plurality of first traverse areas on the back surface of the wafer and respectively along the longitudinal saw streets and traverse saw streets. The widths of the first longitudinal areas and first traverse areas are respectively greater than the widths of the longitudinal saw streets and traverse saw streets. A rectangular second area is defined between each two adjacent first longitudinal areas and each two adjacent first traverse areas. Four third areas are defined on the four corners of the each second area, respectively. Afterward, the wafer is cut from its back surface along the longitudinal and traverse saw streets with a double cutter so that a plurality of first recesses is respectively formed on the first longitudinal areas and first traverse areas, and the wafer is singulated to form individual chip structures. Subsequently, the second areas except for the third areas are sawed or etched to form second recesses so that the third areas are protruding from the back surfaces of the chip structures to form the pedestals of the chip structures.

Since the pedestals of the chip structure according to the present invention are disposed away from the edge of the back surface for a non-zero distance, the pedestals of an upper chip structure of the present invention will not damage the bonding pads on the edge of the active surface of a lower chip structure when the upper chip structure is stacked on the lower chip structure.

The foregoing, as well as additional objects, features and advantages of the invention will be more readily apparent from the following detailed description, which proceeds with reference to the accompanying drawings.

BRIEF DESCRIPTION OF THE DRAWINGS

FIGS. 4a to 4d illustrate the method for manufacturing chip structures, wherein FIG. 4a is a top view illustrating a wafer is adhered to a tape and FIG. 4b is a cross-sectional view of FIG. 4a.

DETAILED DESCRIPTION OF THE PREFERRED EMBODIMENT

Figure 1:
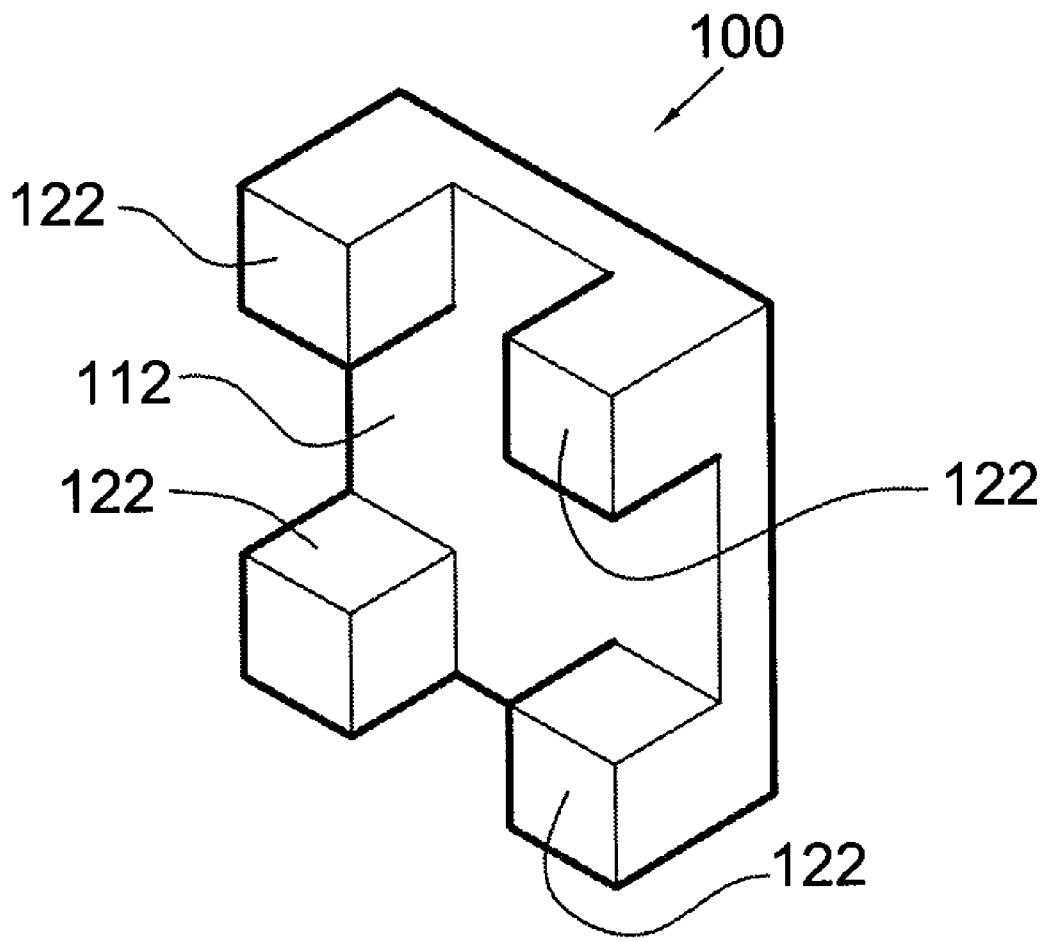
FIG. 1 is a perspective view of a conventional chip structure with pedestals.
Figure 2A:
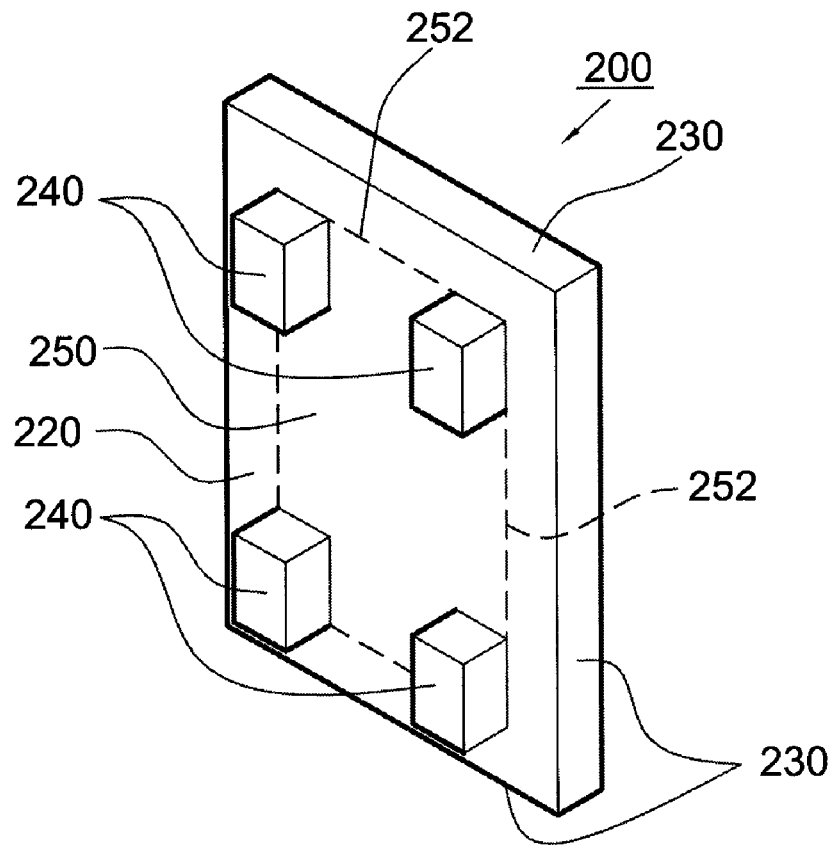
FIG. 2a is a perspective view of a chip structure with pedestals according to the present invention.
Figure 2B:
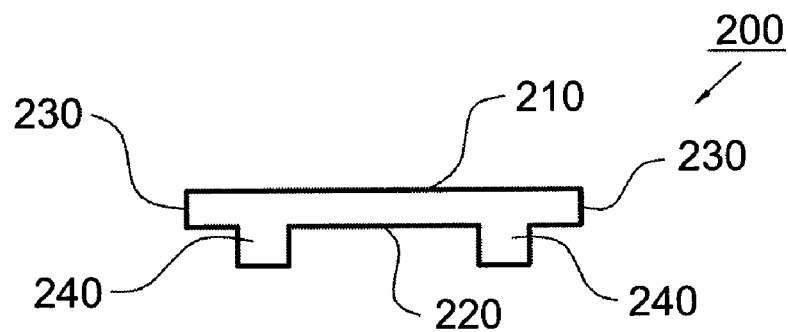
FIG. 2b is a cross-sectional view of a chip structure with pedestals according to the present invention.
Figure 2C:
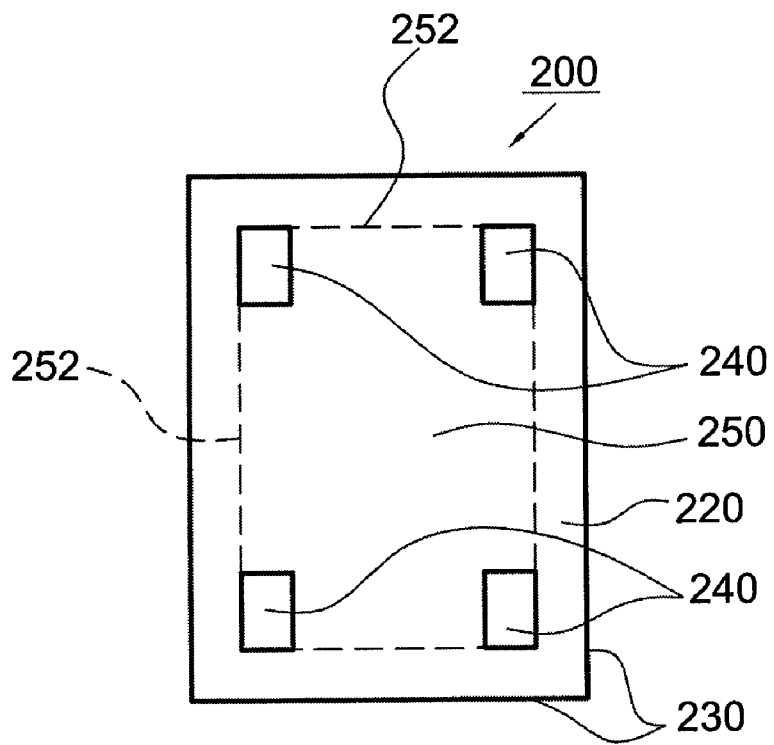
FIG. 2c is a bottom view of a chip structure with pedestals according to the present invention.

Referring to FIGS. 2a, 2b and 2c, the chip structure 200 according to the present invention includes an active surface 210, a back surface 220 opposing to the active surface 210 and a plurality side surfaces 230 extending from the active surface 210 to the back surface 220. A rectangular area 250 is defined on the back surface 220 of the chip structure 200. The area 250 has four sides 252, each of the sides 252 is parallel to and away from one of the side surfaces 230 for a non-zero distance. The chip structure 200 further includes a plurality of pedestals 240 perpendicularly extending from the back surface 220. The pedestals 240 can be four rectangular pedestals respectively disposed on the four corners of the area 250. Specifically, the each pedestal 240 is disposed away from the nearest side surface 230 for a non-zero distance.

Figure 3:
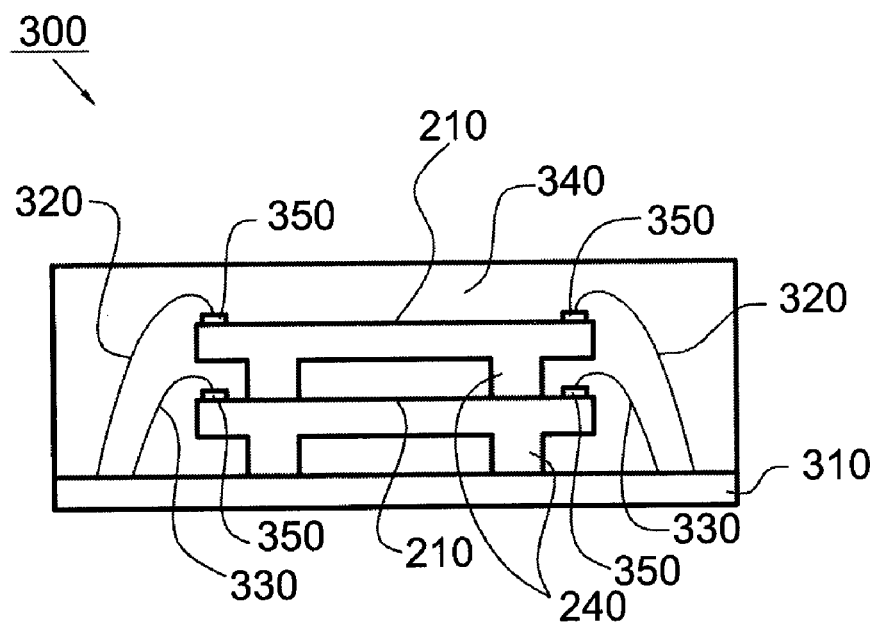
FIG. 3 is a cross-sectional view of a stacked chip package according to the present invention.
Figure 4A:
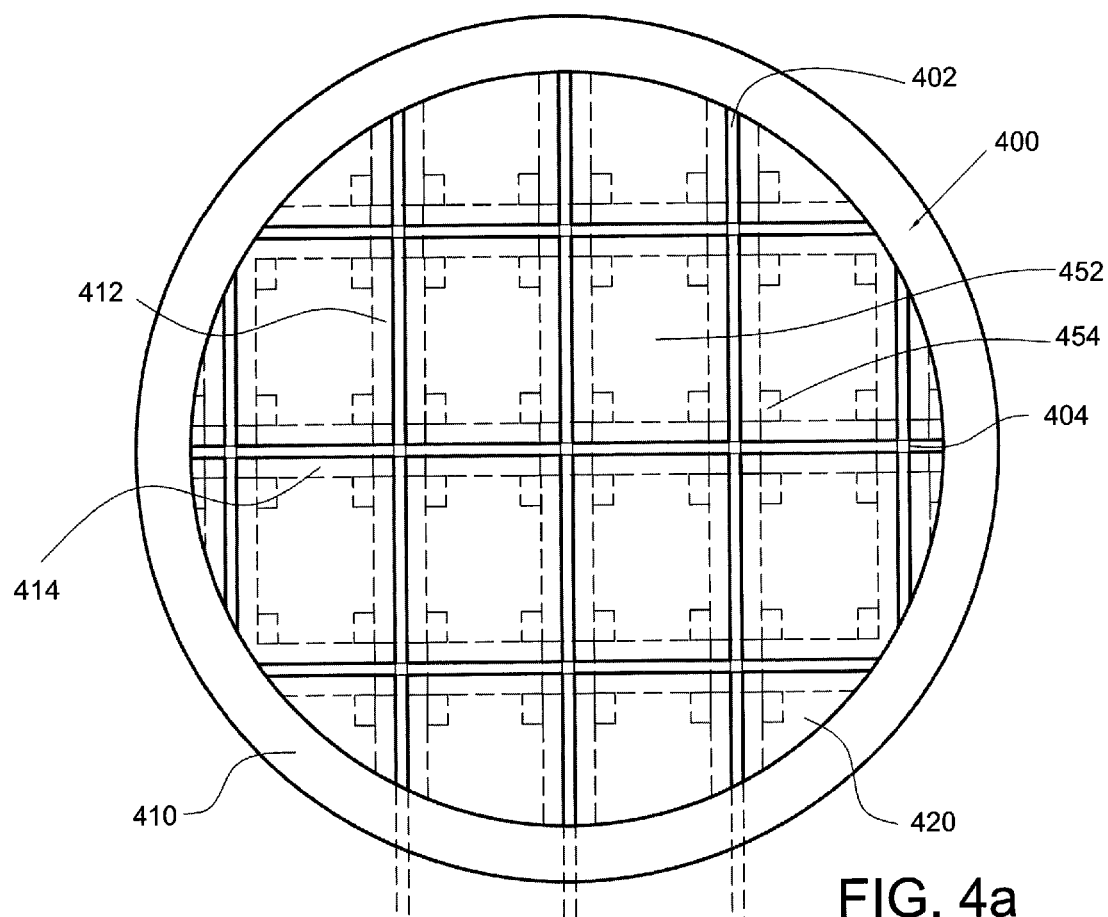
Figure 4B:
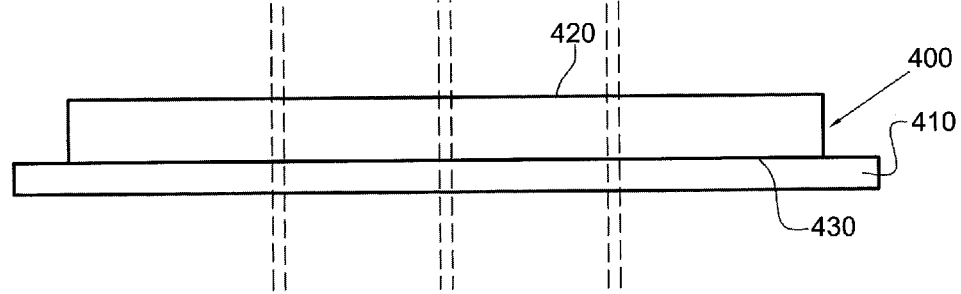
Figure 4C:
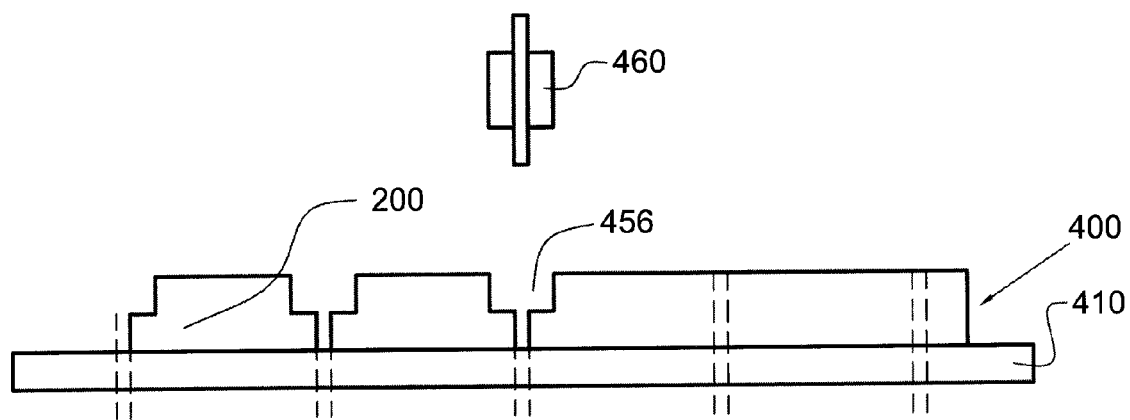
Figure 4D:
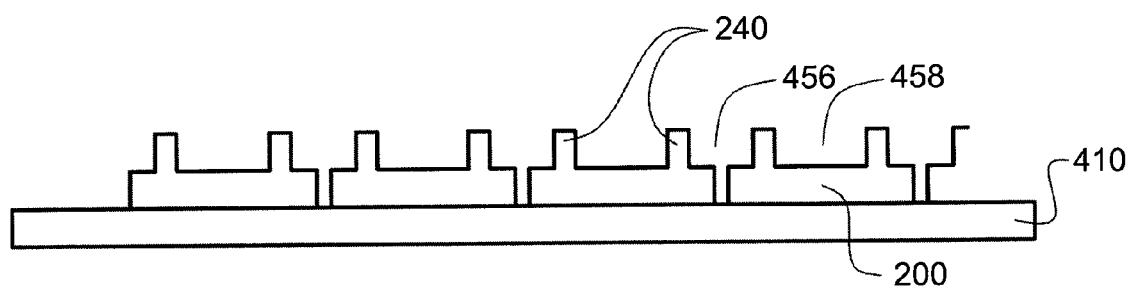

Referring to FIG. 3, the stacked chip package 300 according to the present invention includes two chip structures 200, one of which is the lower chip structure 200 and the other of which is the upper chip structure 200. The pedestals 240 of the lower chip structure 200 is disposed on a carrier 310, such as a substrate and the pedestals 240 of the upper chip structure 200 are disposed on the active surface 210 of the lower chip structure 200 to maintain a gap between the two chip structures 200. The active surface 210 of the upper chip structure 200 is electrically connected to the carrier 310 by a plurality of bonding wires 320 and the active surface 210 of the lower chip structure 200 is electrically connected to the carrier 310 by a plurality of bonding wires 330. A sealant 340 is formed on the carrier 310 to encapsulate the two chip structures 200 and bonding wires 320, 330.

According to the stacked chip package 300 of the present invention, a chip structure 200 is stacked on another chip structure 200. The pedestals 240 of the upper chip structure 200 are used to maintain a gap between the two chip structures 200 so that the upper chip structure 200 is not in contact with the bonding wires 330. Accordingly, there is no need of an additional spacer or dummy chip to maintain the gap between the two chip structures 200. Moreover, since the pedestals 240 extending from the back surface 220 of the chip structure 200 are disposed away from the nearest side surfaces 230 for a non-zero distance, the pedestals 240 of the upper chip structure 200 will not damage the bonding pads 350 on the edge of the active surface 210 of the lower chip structure 200 when the upper chip structure 200 is stacked on the lower chip structure 200. It is appreciated that the lower chip structure 200 can be replaced with a substantially equally-sized chip structure. Furthermore, the bonding pads 350 on the active surface 210 of the lower chip structure 200 have to be disposed between the pedestals 240 of the upper chip structure 200 and the edge of the active surface 210 of the lower chip structure 200.

Referring to FIGS. 4a to 4d, they illustrate the method for manufacturing chip structures according to the present invention. First, an integrated circuit wafer 400 is provided. A plurality of integrated circuits (not shown in the figure) is positioned on the active surface 430 of the wafer 400 and separated from each other by a plurality of longitudinal saw streets 402 and a plurality of traverse saw streets 404. Moreover, a plurality of longitudinal areas 412 and a plurality of traverse areas 414 are defined on the back surface 420 of the wafer 400 and respectively along the longitudinal saw streets 402 and traverse saw streets 404. The widths of the longitudinal areas 412 and traverse areas 414 are respectively greater than the widths of the longitudinal saw streets 402 and traverse saw streets 404. A rectangular area 452 is defined between each two adjacent longitudinal areas 412 and each two adjacent traverse areas 414. Four areas 454 are defined on the four corners of the each area 452, respectively, and separated from each other. Furthermore, the active surface 430 of the wafer 400 is adhered to a tape 410 and the back surface 420 of the wafer 400 is positioned up (see FIGS. 4a and 4b).

Afterward, the wafer 400 is cut from the back surface 420 along the saw streets 402, 404 with a double cutter 460 so that a plurality of recesses 456 is respectively formed on the areas 412, 414 and the wafer 400 is singulated to form individual chip structures 200. More specifically, the resulting chip structure 200 cut from the wafer 400 has a central protrusion and an indentation surrounding the protrusion (see FIG. 4c).

Subsequently, the back surfaces of the chip structures 200 are mechanically or chemically processed by such as sawing or etching so that recesses 458 are formed on the areas 452 except for the areas 454 and are in connection with the recesses 456. As a result, the areas 454 are protruding from the back surfaces of the chip structures 200 and formed as the pedestals 240 (see FIG. 4d).

It is to be noted that the formation of the recesses 456 and the singulation of the wafer 400 can be carried out in two steps. More specifically, the recesses 456 can be formed before the wafer 400 is singulated, and vice versa. Furthermore, the recesses 456 can be formed by etching.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A method for manufacturing chip structures, comprising the steps of:

providing a wafer, the wafer having an active surface and a back surface opposing to the active surface, a plurality of longitudinal saw streets and a plurality of traverse saw streets defined on the back surface of the wafer, a plurality of first longitudinal areas and a plurality of first traverse areas defined on the back surface of the wafer and respectively along the longitudinal saw streets and traverse saw streets, the widths of the first longitudinal areas and first traverse areas are respectively greater than the widths of the longitudinal saw streets and traverse saw streets, a second area defined between each two adjacent first longitudinal areas and each two adjacent first traverse areas, a plurality of third areas defined on the each second area and separated from each other;

forming a plurality of first recesses on the first longitudinal areas and first traverse areas;

forming a plurality of second recesses on the second areas except for the third areas, the second recesses in connection with the first recesses; and singulating the wafer along the longitudinal and traverse saw streets.

2. The method as claimed in claim 1, wherein the formation of the first recesses and the singulation of the wafer are simultaneously achieved with a double cutter.

3. The method as claimed in claim 1, wherein the second recesses are formed by sawing.

4. The method as claimed in claim 1, wherein the second recesses are formed by etching.

5. The method as claimed in claim 1, wherein the second areas are rectangular and the third areas are located on the corners of the second areas.

* * * * *